(12) United States Patent
Serebryanov et al.

(10) Patent No.: US 8,993,933 B2
(45) Date of Patent: Mar. 31, 2015

(54) TOP WAFER ROTATION AND SUPPORT

(71) Applicant: Applied Materials, Inc., Santa Clara, CA (US)

(72) Inventors: Oleg Serebryanov, San Jose, CA (US); Joseph M. Ranish, San Jose, CA (US); Aaron Muir Hunter, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 13/749,550

(22) Filed: Jan. 24, 2013

(65) Prior Publication Data
US 2013/0193132 A1    Aug. 1, 2013

Related U.S. Application Data

(60) Provisional application No. 61/591,110, filed on Jan. 26, 2012.

(51) Int. Cl.
| | |
|---|---|
| *F27B 5/14* | (2006.01) |
| *F27D 11/00* | (2006.01) |
| *F27B 17/00* | (2006.01) |
| *H01L 21/67* | (2006.01) |
| *H01L 21/687* | (2006.01) |
| *F26B 19/00* | (2006.01) |

(52) U.S. Cl.
CPC ............ *F27D 11/00* (2013.01); *F27B 17/0025* (2013.01); *H01L 21/67115* (2013.01); *H01L 21/68785* (2013.01)

USPC ............ 219/390; 219/385; 392/416; 118/724

(58) Field of Classification Search
USPC .......... 219/390, 405, 385, 411; 392/416, 418; 118/724, 725, 50.1
See application file for complete search history.

(56) References Cited

U.S. PATENT DOCUMENTS

| | | | |
|---|---|---|---|
| 6,035,100 A | 3/2000 | Bierman et al. | |
| 2007/0291818 A1 | 12/2007 | Yasuda et al. | |
| 2009/0274454 A1 | 11/2009 | Aderhold et al. | |
| 2012/0187083 A1* | 7/2012 | Hashizume | 216/37 |

FOREIGN PATENT DOCUMENTS

| | | |
|---|---|---|
| JP | 08-187426 A | 7/1996 |
| KR | 2003-0095579 A | 12/2003 |

OTHER PUBLICATIONS

International Search Report and Written Opinion, dated Apr. 30, 2013, PCT Applicatin No. PCT/US2013/021470.

* cited by examiner

*Primary Examiner* — Shawntina Fuqua
(74) *Attorney, Agent, or Firm* — Patterson & Sheridan, LLP

(57) ABSTRACT

Embodiments of the present invention provide thermal processing chambers including a drive mechanism and a heating assembly disposed on opposite sides of a substrate support assembly. Particularly, the heating assembly is disposed below the substrate support assembly to process a substrate with a device side facing up and the drive mechanism is disposed above the substrate assembly.

17 Claims, 15 Drawing Sheets

TOP WAFER ROTATION AND SUPPORT

CROSS-REFERENCE TO RELATED APPLICATIONS

This application claims benefit of U.S. Provisional Patent Application Ser. No. 61/591,110, filed Jan. 26, 2012, which is herein incorporated by reference.

BACKGROUND

1. Field

Embodiments of the present invention generally relate to apparatus and methods for processing semiconductor substrates. Particularly, embodiments of the present invention relate to processing a semiconductor substrate in a rapid thermal processing chamber.

2. Description of the Related Art

Rapid thermal processing (RTP) is a process for annealing substrates during semiconductor processing. During RTP, a substrate is generally supported by a supporting device near the edge region and rotated as the substrate is heated by a heat source. Thermal radiation is generally used to rapidly heat a substrate in a controlled environment to a maximum temperature of up to about 1350° C. The maximum temperature is maintained for a specific amount of time ranging from less than one second to several minutes depending on the process. The substrate is then cooled to room temperature for further processing. High intensity tungsten halogen lamps are commonly used as the source of heat radiation. The substrate may be provided additional heat by a heated susceptor conductively coupled to the substrate.

In semiconductor fabrication, RTP may be performed as part of various processes, such as thermal oxidation. An RTP chamber is usually part of a cluster tool where the RTP chamber shares a factory interface and a substrate transfer robot with various other processing chambers. Since semiconductor substrates are generally processed with a device side facing up, an RTP chamber also has the configuration of positioning the substrates with the device side facing up in order to share the substrate transfer devices with other processing chambers. With the substrate positioned device side facing up, RTP chambers usually have a heating source positioned below the substrate so that the substrate can be heated from the backside to achieve uniform heating. The heating source is sized at least as large as the substrate to cover the entire substrate. Thus, traditional RTP chambers generally have a substrate support assembly for supporting and rotating a substrate above a heating source disposed under a chamber body and actuators of the substrate support surrounding the heating source. As a result, traditional RTP chambers have large substrate support actuators and a large footprint.

FIG. 1 schematically illustrates a traditional RTP chamber 100. The RTP chamber 100 includes a heating assembly 106 disposed outside a chamber body 102 under a transparent chamber bottom 103 for dispensing infrared radiation. The heating assembly 106 includes a plurality of radiant heating sources 104 disposed in a frame 108. The plurality of radiant heating sources 104 may be any suitable energy sources, such as heating lamps, laser diodes, light emitting diodes. A substrate support 110 positions a substrate 114 over the heating assembly 106. The substrate support 110 is mounted over an actuator assembly 112 disposed around the heating assembly 106. The actuator assembly 112 is configured to vertically move and rotate the substrate support 110 during processing. In order to heat the substrate 114 in a substantially uniform manner, the frame 108 is usually larger than the substrate 114 to distribute the plurality of lamps 104 across the entire substrate 114. The frame 108 usually also includes cooling structures that further increases the size. As a result, the actuator assembly 112 which surrounds the heating assembly 106 and the chamber body 102 which encloses the substrate support 110 are much larger than the substrate 114 being processed. As shown in FIG. 1, the diameter D of the chamber body 102 is much larger than the diameter d of the substrate 114.

Therefore, there is a need for a RTP chamber with reduced chamber size and footprint.

SUMMARY OF THE INVENTION

Embodiments of the present invention generally provide apparatus and methods for thermal processing a substrate.

One embodiment of the present invention provides an apparatus for thermal processing a substrate. The apparatus comprises a chamber body defining a processing volume and a heating assembly disposed under the processing volume. The heating assembly comprises a plurality of radiant heating sources directing radiant energy toward the processing volume. The apparatus further comprises a substrate support assembly configured to position a substrate over the heating assembly in the processing volume, and a drive mechanism configured to rotate the substrate support assembly and move the substrate assembly vertically. The drive mechanism is disposed above the substrate support assembly.

Another embodiment of the present invention provides a method for processing a substrate. The method comprises suspending a substrate in a processing chamber over a heating assembly with a substrate support assembly. A drive mechanism and the heating assembly are disposed on opposite sides of the substrate support assembly. The method further comprises rotating the substrate using the drive mechanism, and directing radiant energy towards a backside of the substrate from the heating assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide thermal processing chambers including a drive mechanism and a heating assembly disposed on opposite sides of a substrate support assembly. Particularly, the heating assembly is disposed below the substrate support assembly to process a substrate with a device side facing up and the drive mechanism is disposed above the substrate assembly. Because the drive mechanism is positioned on the opposite side of the heating assembly, the drive mechanism does not have to be larger than the heating assembly as in traditional thermal processing chambers.

FIGS. 2-5 describe several thermal processing chambers including a central drive mechanism disposed above a substrate support assembly while a heating assembly is disposed below the substrate support assembly according to embodiments of the present invention. A disk is used to couple the central drive mechanism and a plurality of brackets for suspending a substrate over the heating assembly by contacting an edge region of the substrate. Alternatively, the disk may be completely or partially replaced by a spider-like structure having radially projecting arms for supporting the edge region of the substrate. Alternatively, the disk may include multiple holes to allow gas flow therethrough.

Figure 1:
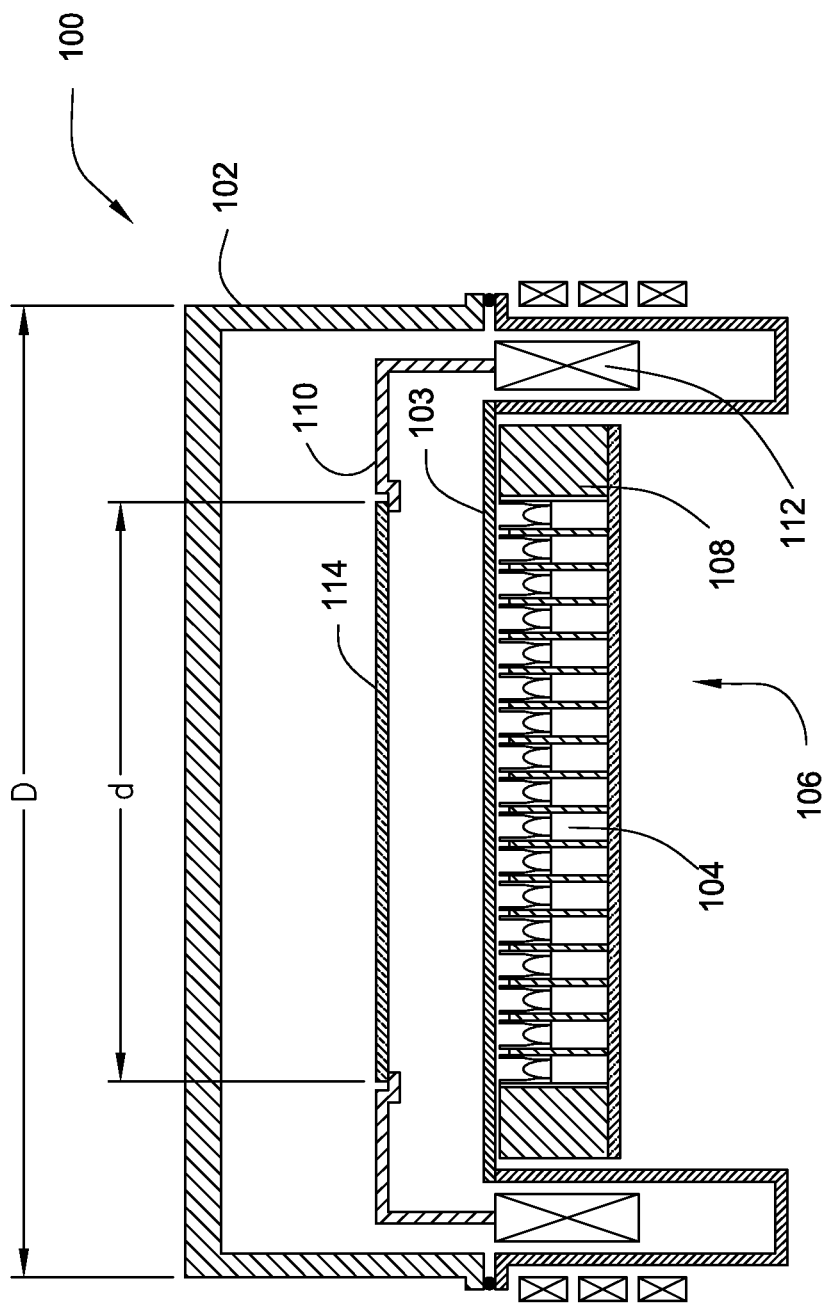
FIG. 1 is a schematic side view of a traditional thermal processing chamber.
Figure 2A:
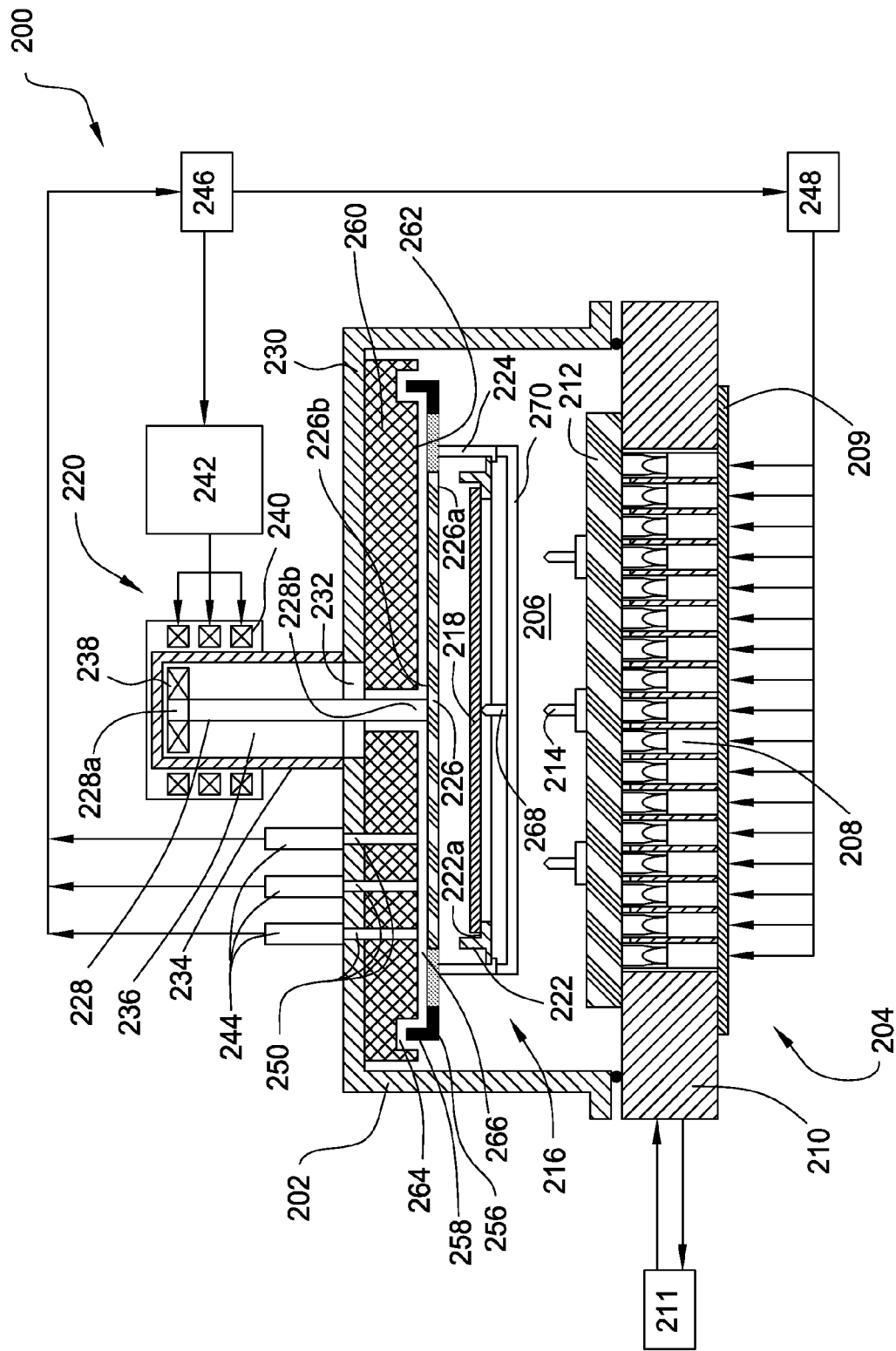
FIG. 2A is a schematic sectional side view of a thermal processing chamber according to one embodiment of the present invention.

FIG. 2A is a schematic sectional side view of a thermal processing chamber 200 according to one embodiment of the present invention. The thermal processing chamber 200 includes a heating assembly 204 disposed under a chamber body 202. The heating assembly 204 includes a frame 210 having a plurality of radiant heating sources 208 disposed therein and a power distribution board 209 for connecting the plurality of radiant heating sources 208 to a heating power source 248. In one embodiment, the plurality of radiant heating sources 208 may be connected in two or more groups to form two or more heating zones. The frame 210 may be connected to a cooling fluid source 211 to be cooled during operation. The heating assembly 204 and the chamber body 202 define a processing volume 206. A quartz window 212 is disposed over the heating assembly 204 to allow thermal energy from the plurality of radiant heating sources 208 to the processing volume 206. Three or more push pins 214 are disposed over the quartz window 212 for substrate loading and unloading. The push pins 214 may be formed from quartz.

The thermal processing chamber 200 includes a substrate support assembly 216 configured to suspend a substrate 218 within the processing volume 206 above the quartz window 212. The substrate support assembly 216 may also rotate the substrate 218 during processing. The substrate support assembly 216 includes a driving mechanism 220 disposed above the processing volume 206.

The substrate support assembly 216 includes an edge ring 222 having an annular substrate supporting surface 222*a* configured to contact and support the substrate 218 at an edge region. The edge ring 222 is supported by three or more brackets 224 hanging from a lower surface 226*a* of a disk 226. A shaft 228 extends upward from an upper surface 226*b* of the disk 226. In one embodiment, the shaft 228 may extend near a center of the disk 226. The shaft 228 extends through a central opening 232 of a chamber lid 230 and is further coupled to the driving mechanism 220.

According to one embodiment of the present invention, the driving mechanism 220 is a magnetic rotor. The thermal processing chamber 200 includes a cylinder 234 coupled to the chamber lid 230 around the central opening 232. The shaft 228 extends into an inner volume 236 of the cylinder 234. The cylinder 234 may be formed from a non-ferromagnetic material. An upper end 228*a* of the shaft 228 may be coupled to a permanent magnet 238 disposed in the inner volume 236 of the cylinder 234. Electromagnets 240 are mounted on the cylinder 234 from outside. During operation, the electromagnets 240 are magnetically coupled to the permanent magnets 238 to move the permanent magnets 238. The electromagnets 240 are controlled by a drive controller 242 configured to generate and control magnetic fields in the electromagnets 240. The magnetic fields of the electromagnets 240 interact with the permanent magnet 238 to move the permanent magnet 238 vertically and/or rotate the permanent magnet 238 causing the edge ring 222 and the substrate 218 thereon to move vertically and/or rotate.

The thermal processing chamber 200 also includes a plurality of pyrometers 244 disposed over the chamber lid 230. The plurality of pyrometers 244 are configured to measure temperatures on various locations of the substrate 218 through a plurality of view ports 250. The plurality of pyrometers 244 may be connected to a system controller 246. The system controller 246 can provide control signals to the drive controller 242 and/or the heating power source 248 to realize closed loop control.

The disk 226, the shaft 228 and the brackets 224 may be formed from high temperature materials that are also compatible with processing chemistry. In one embodiment, the disk 226, the shaft 228 and the brackets 224 are formed from quartz. The upper end 228*a* of the shaft 228 may be fixedly coupled to the permanent magnet 238. For example, the shaft 228 and the permanent magnet 238 may be joined by glue. A lower end 228*b* of the shaft 228 may be fixedly joined to the disk 226. For example, the shaft 228 and the disk 226 may be fused, welded or soldered together. The brackets 224 may be fixedly joined to the disk 226. For example, the brackets 224 and the disk 226 may be fused, welded or soldered together.

The disk 226 may be substantially planar and provide structure support to the brackets 224 and the edge ring 222. The disk 226 may have multiple zones with different surface properties. In one embodiment, the disk 226 may have a lip 258 extending upwards from the outer annular zone 256. The lip 258 may also have reflective surfaces or absorptive surfaces to prevent stray lights from entering the view ports 250 from the sides. Inner walls of the chamber body 202 may include or be coated with a material which absorbs radiation of wavelength within the operating range of the pyrometers 244. In one embodiment, the inner walls of the chamber body 202 may be coated with a film stack designed to reflect radiation in wavelengths outside the operating range of the pyrometers 244 and to absorb radiation of wavelength within the operating range of the pyrometers 244.

In an alternative embodiment, the disk 226 may be completely or partially replaced by a spider-like structure having radially projecting arms for supporting the edge region of the substrate 218 directly or through the edge ring 222. In another embodiment, the disk 226 may include multiple holes to allow gas flow therethrough.

Optionally, the thermal processing chamber 200 may include a reflective plate 260 disposed under the chamber lid 230. The reflective plate 260 may have a reflective surface 262 facing the disk 226 and the substrate 218. The reflective plate 260 may function to reflect thermal energy back to the substrate 218 during heating thus improving thermal efficiency. The reflective plate 260 may also act as a virtual black body cavity and reduced the influence of emissivity of the chamber components over the pyrometers 244. The reflective plate 260 may also function as a heat sink for cooling the substrate 218 after a rapid thermal processing.

The view ports 250 are formed through both the chamber lid 230 and the reflective plate 260. In one embodiment, the reflective plate 260 may have a circular recess 264 configured to receive the lip 258 of the disk 226 and further prevent stray lights from entering volume 266 between the disk 226 and the reflective plate 260.

Optionally, the substrate support assembly 216 may include one or more support pins 268 for supporting the back side of the substrate 218 during processing. The support pin 268 may be positioned to prevent the substrate 218 from deformation during heating or cooling. The tip of the support pin 268 may be in the same plane as the substrate support surface 222a of the edge ring 222. The support pin 268 may be attached to a frame 270 attached to the brackets 224. As shown in FIG. 2A, one support pin 268 may be positioned to support a center of the substrate 218. Alternatively, the support pins 268 may be positioned at other locations. For example, three support pins 268 may be positioned within an annular area support contact and support the substrate along an annular region.

In an alternative embodiment, the substrate 218 may be supported completely by the support pin 268 without contacting the edge ring 222. The edge ring 222 may be omitted completely or only present for providing the pyrometers 244 a shield against stray light from the radiant heating sources 208. By omitting the edge ring 222 or avoid contacting the substrate 228 with the edge ring 222, heating variation caused by edge ring-substrate contact may be reduced and heating uniformity improved.

In one embodiment, the support pin 268 and the frame 270 may also be made from quartz. Alternatively, the substrate 218 may be supported completely by the support pins 268 during processing while the edge ring 222 is absent.

Figure 2B:
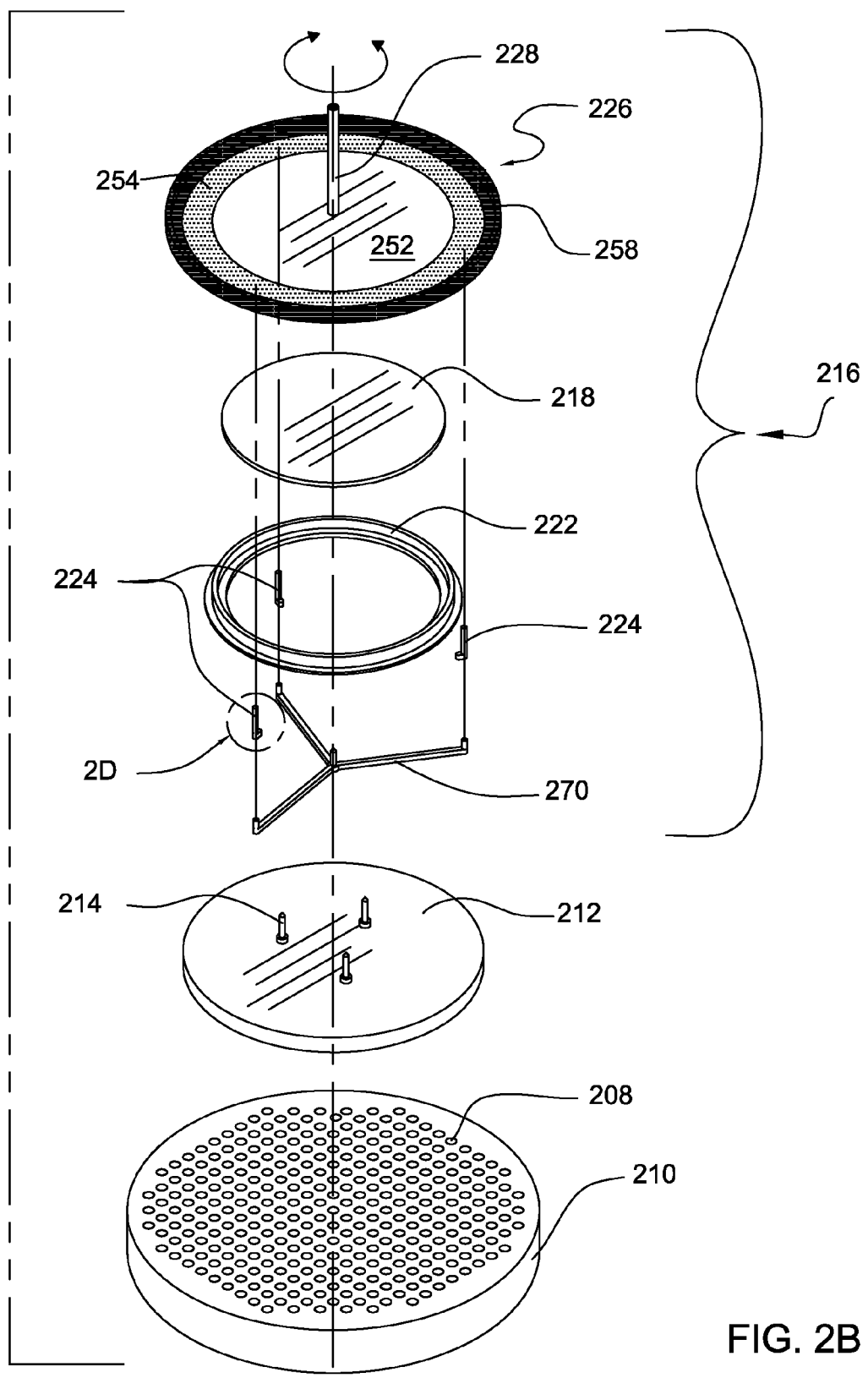
FIG. 2B is a schematic exploded view of the thermal processing chamber of FIG. 2A without the chamber body.

FIG. 2B is a schematic exploded view of the thermal processing chamber 200 without the chamber body 202, the reflective plate 260 and the drive mechanism 220.

Figure 2C:
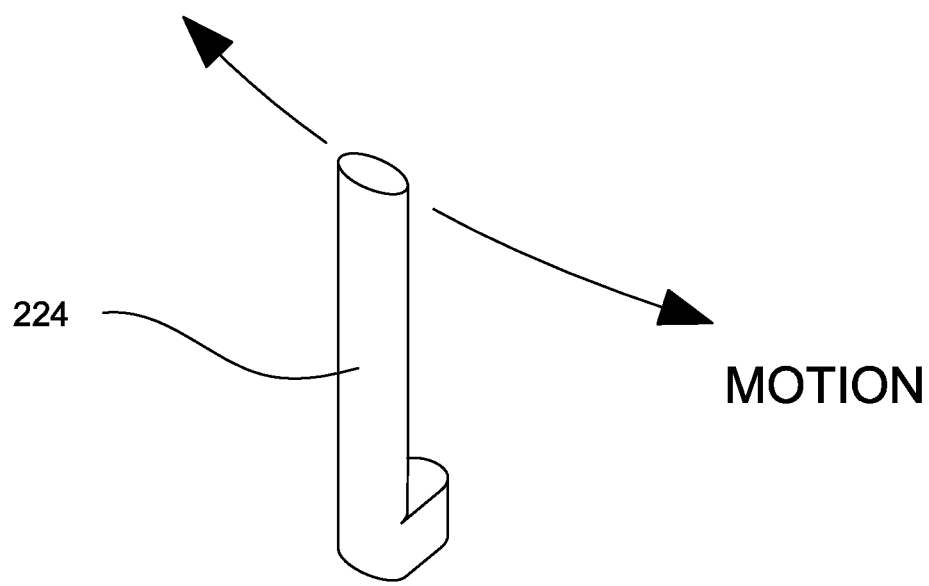
FIG. 2C is a schematic sectional view of a bracket of the thermal processing chamber of FIG. 2A.

The cross section of the brackets 224 may be designed to minimize or create fluid turbulence depending on the processing recipes. FIG. 2C is a schematic sectional view of the bracket 224 according to one embodiment of the present invention. The bracket 224 has a tear drop shaped cross section to minimize fluid turbulence during processing.

FIG. 2A illustrates the thermal processing chamber 200 in a processing position. In the processing position, the substrate 218 rests on the edge ring 222 being supported and rotated by the substrate support assembly 216. The shaft 228 is raised to lift the substrate 218, the brackets 224 and the frame 270 up from the push pins 214 so that the substrate 218 can be rotated.

Figure 2E:
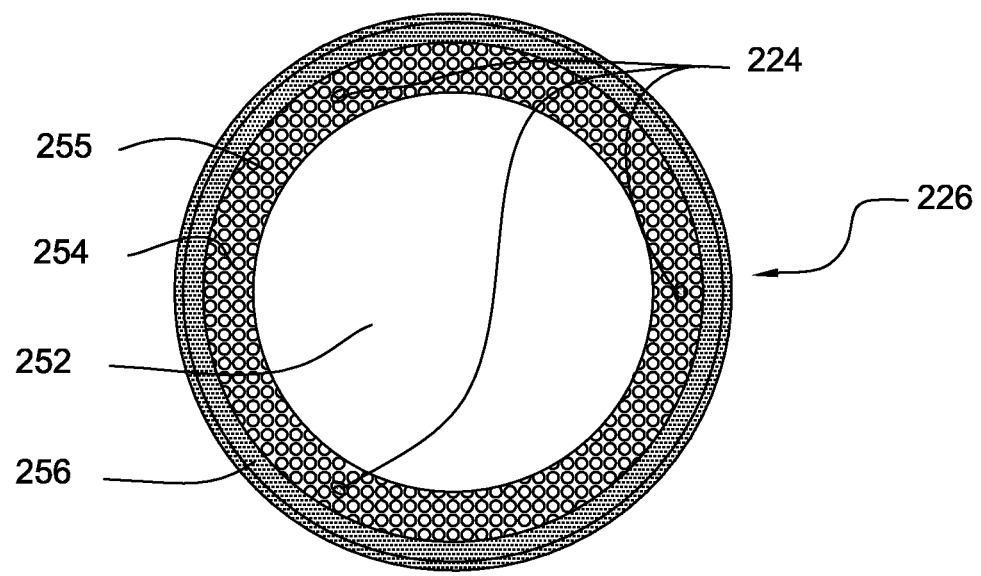
FIG. 2E is a top view of a disk in a substrate support assembly of the thermal processing chamber of FIG. 2A.
Figure 2D:
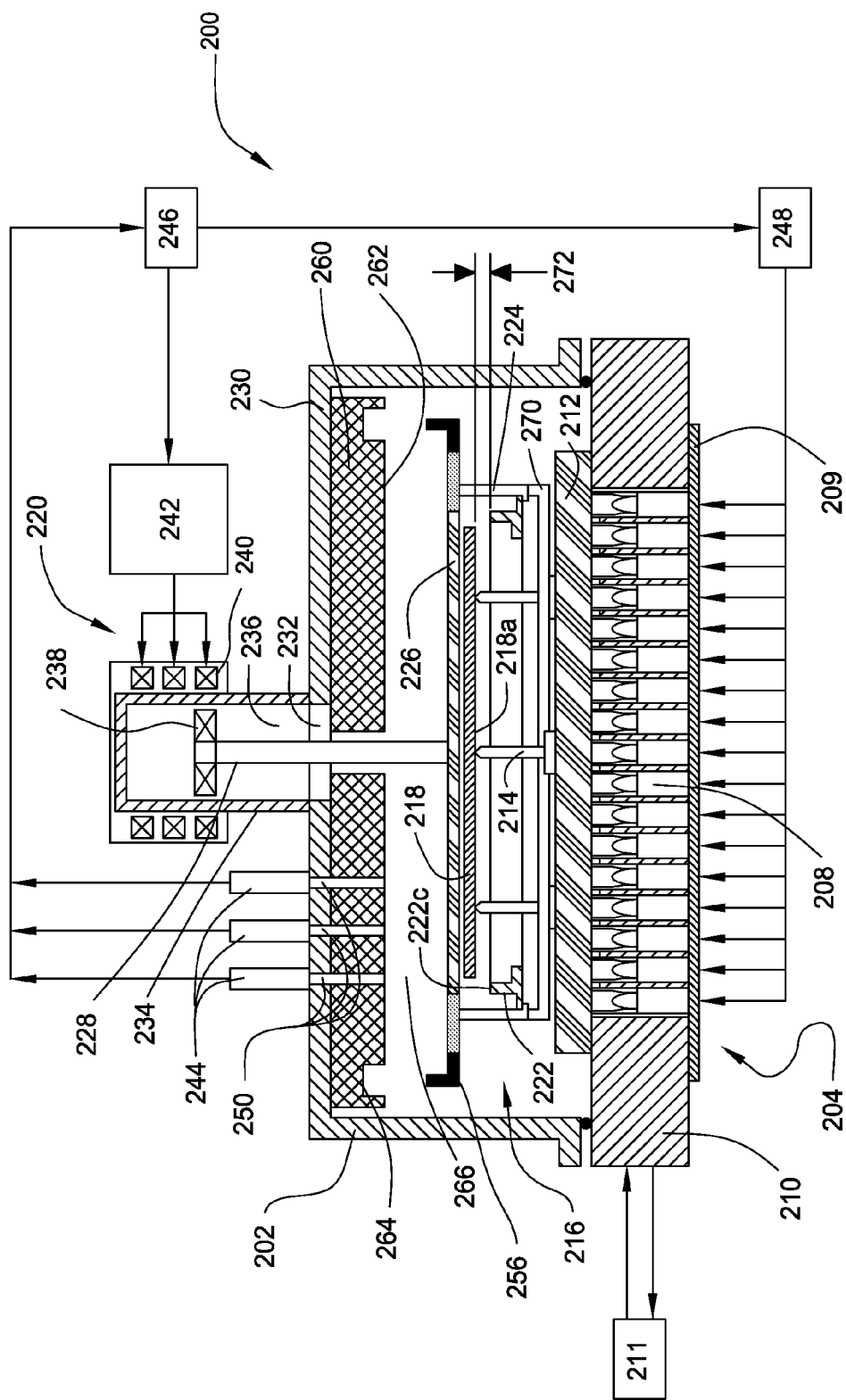
FIG. 2D is a partial side view of the thermal processing chamber of FIG. 2A at a substrate loading position.

FIG. 2D is a partial side view of the thermal processing chamber 200 at a substrate loading position, in which the substrate 218 can be loaded and unloaded. In the loading position, the shaft 228 is lowered so that the edge ring 222 is below the tips of the push pins, thereby positioning the substrate 218 on the push pins 214. A substrate transfer robot may come in a gap 272 between a backside 218a of the substrate 218 and a top surface 222c of the edge ring 222 to pick up and unload the substrate 218 from the thermal processing chamber 200. The substrate transfer robot may then deliver a new substrate onto the push pins 214 and exit the thermal processing chamber 200. After the substrate transfer robot exits, the shaft 228 may be raised again to pick up the new substrate and positioned the new substrate in the processing position shown in FIG. 2A.

As discussed above, the disk 226 not only provides structural support to the brackets 224, but also ensures accurate temperature measurement of the pyrometers 244 by reducing and preventing stray lights, such as lights from the radiant heating sources 208 and the reflective lights from the chamber surfaces, from entering the view ports 250 of the pyrometers 244. FIG. 2E is a top view of the disk 226 shown in FIG. 2A. As shown in FIG. 2E, the disk 226 includes a central zone 252 corresponding to the surface area of the substrate 218 being processed, a middle annular zone 254 where the brackets 224 are attached to the disk 226, and an outer annular zone 256. The central zone 252, the middle annular zone 254 and the outer annular zone 256 may have different optical properties to ensure accurate temperature measurement by the plurality of pyrometers 244. For example, the outer annular zone 256 may have reflective surfaces, absorptive surfaces, or a combination of reflective and absorptive surfaces on one side or both sides to prevent any stray lights from the radiant heating sources 208 from entering the view ports 250. The middle annular zone 254 may include bubbles 255 that diffuse lights from inner surfaces of the chamber to facilitate attenuation of the diffused lights. Alternatively, the middle annular zone 254 may have reflective surfaces, absorptive surface, or a combination of reflective and absorptive surfaces on one or both sides to prevent any stray light from the heating sources 208 of wavelength within the operating range of the pyrometers 244 from entering the view ports 250. At least a portion of the disk 226 is transparent or at least transparent to lights at wavelengths within the operating range of the pyrometers to allow the plurality of pyrometers 244 to measure temperatures of the substrate 218.

Figure 3:
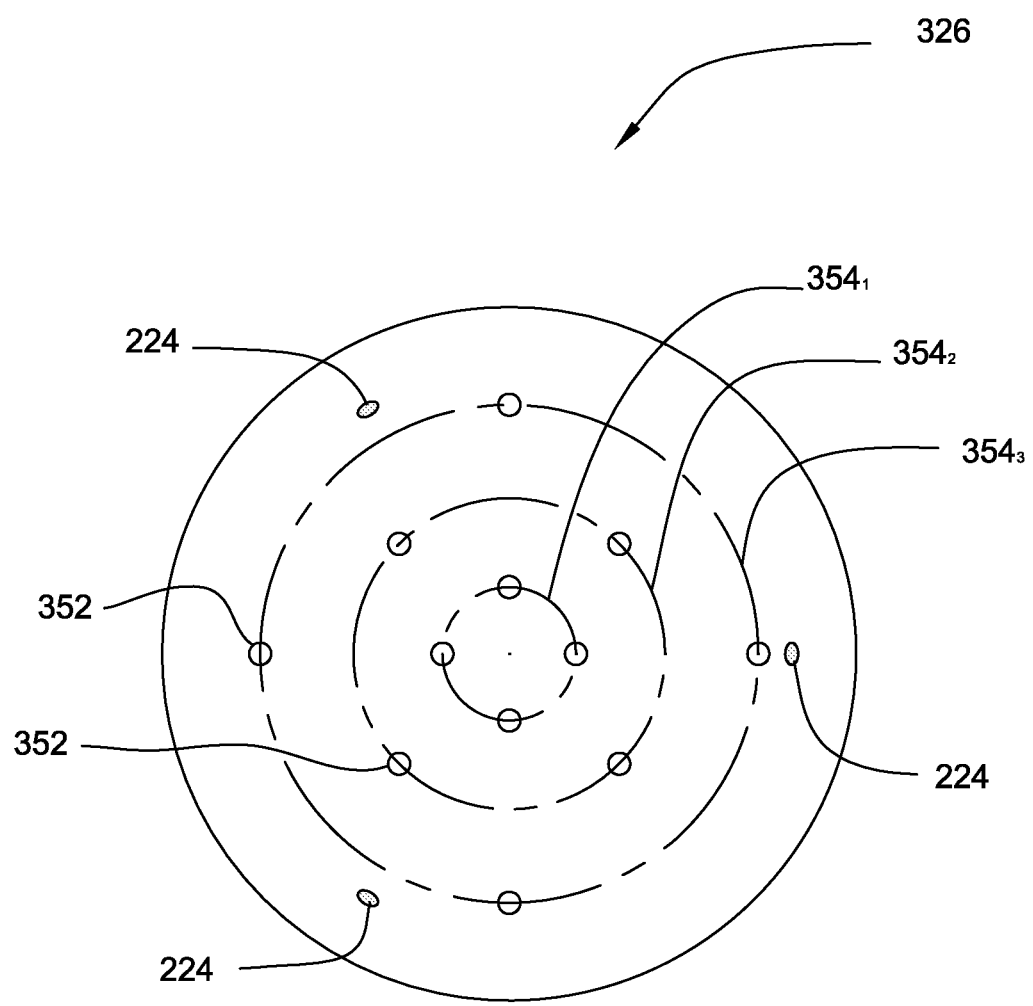
FIG. 3 is a top view of a disk for a substrate support according to another embodiment of the present invention.

FIG. 3 is a top view of a disk 326 for a substrate support according to another embodiment of the present invention. The disk 326 may be used in place of the disk 226. Unlike the disk 226, the disk 326 does not include multiple zones. The disk 326 has an entirely reflective surface except a plurality of windows 352. The windows 352 may be transparent or at least transparent to lights at wavelengths within the operating range of the pyrometers. The plurality of windows 352 are distributed along a plurality of concentric circles $354_1$, $354_2$, $354_3$. The plurality of concentric circles $354_1$, $354_2$, $354_3$ correspond to radial locations of the plurality of pyrometers 244. When the disk 326 rotates during processing, lights from the substrate 218 may enter each of the plurality of pyrometers 244 through the corresponding windows 352. Each of the windows 352 may be sized according to the viewing angle of the pyrometers 244 and the distance between the view ports 250 and the disk 326. The configuration of the disk 326 allows enough light from the substrate 218 to enter the pyrometers 244 through the windows 352 while reflecting the rest of lights by the reflective surface.

Figure 4A:
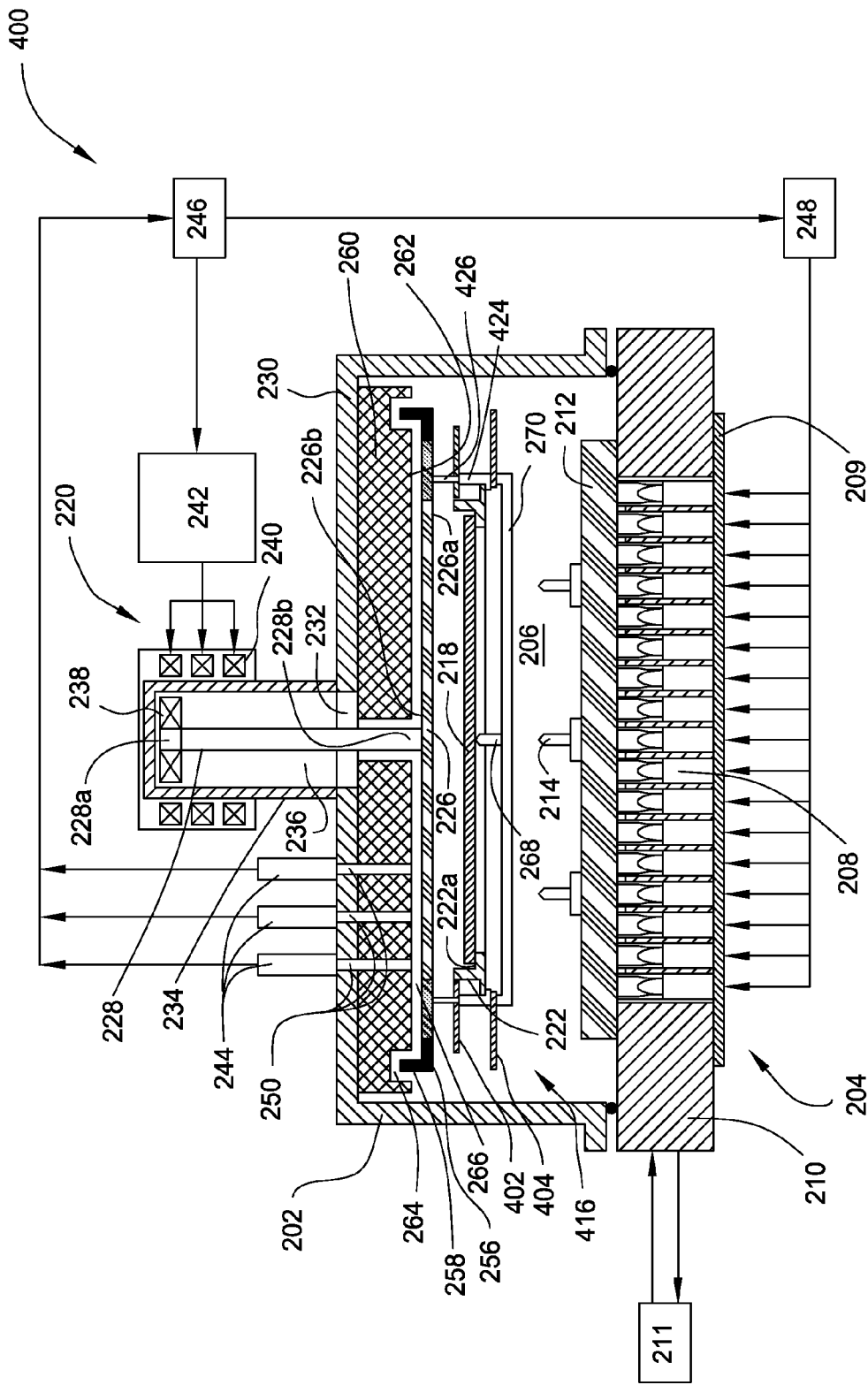
FIG. 4A is a sectional view of a thermal processing chamber according to one embodiment of the present invention.

FIG. 4A is a sectional view of a thermal processing chamber 400 according to one embodiment of the present invention. The thermal processing chamber 400 is similar to the thermal processing chamber 200 of FIG. 2A except the thermal processing chamber 400 includes a substrate support assembly 416 having opaque annular rings 402, 404 outside brackets 426. The opaque annular rings 402, 404 are configured to prevent lights from the radiant heating sources 208 to enter the view ports 250 of the pyrometers 244. In one embodiment, the opaque annular rings 402, 404 may be formed from silicon carbide.

Figure 4B:
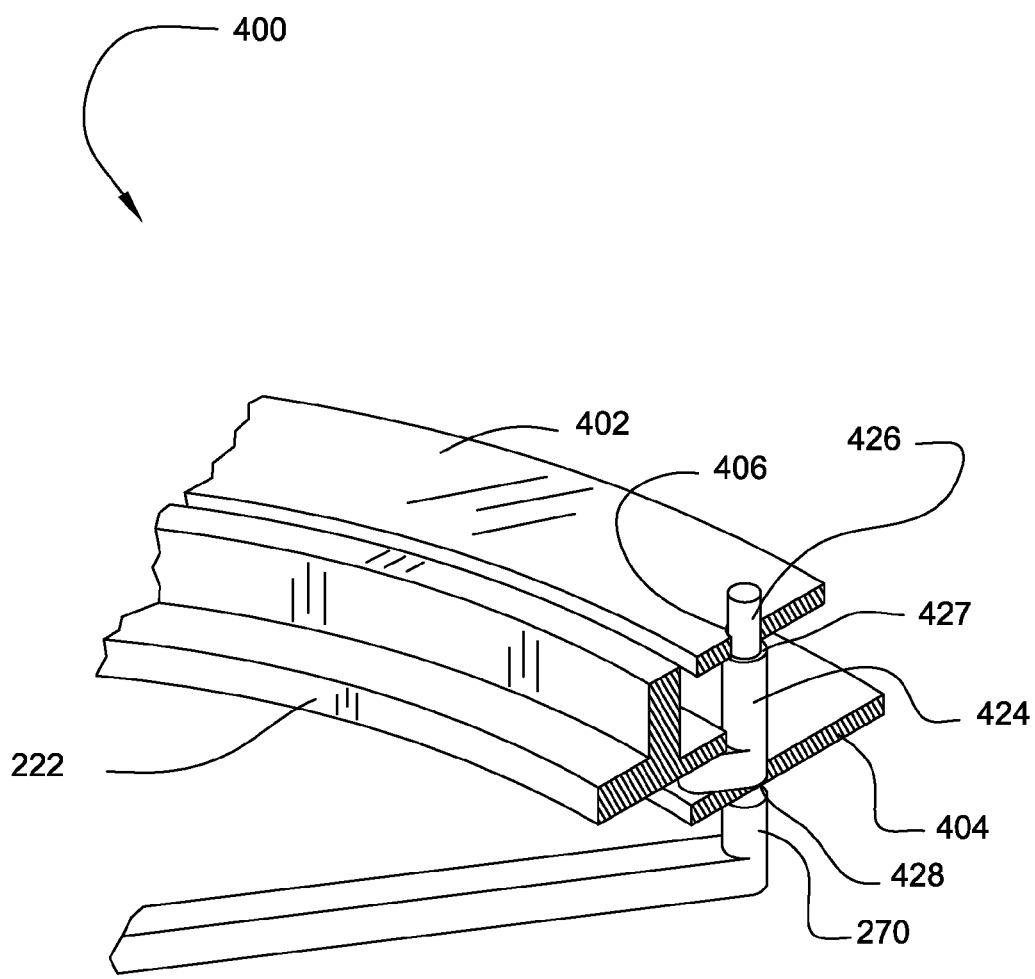
FIG. 4B is a partial sectional perspective view of a substrate support assembly of FIG. 4A.

FIG. 4B is a partial sectional perspective view of the thermal processing chamber 400 showing opaque annular rings 402, 404 coupled to the brackets 424. The opaque annular ring 402 may have three or more through holes 406 to receive the brackets 424. The bracket 424 may have a step 427 for supporting the opaque annular ring 402. The opaque annular ring 404 may be fixedly joined to the brackets 424 at lower ends 428.

Figure 5:
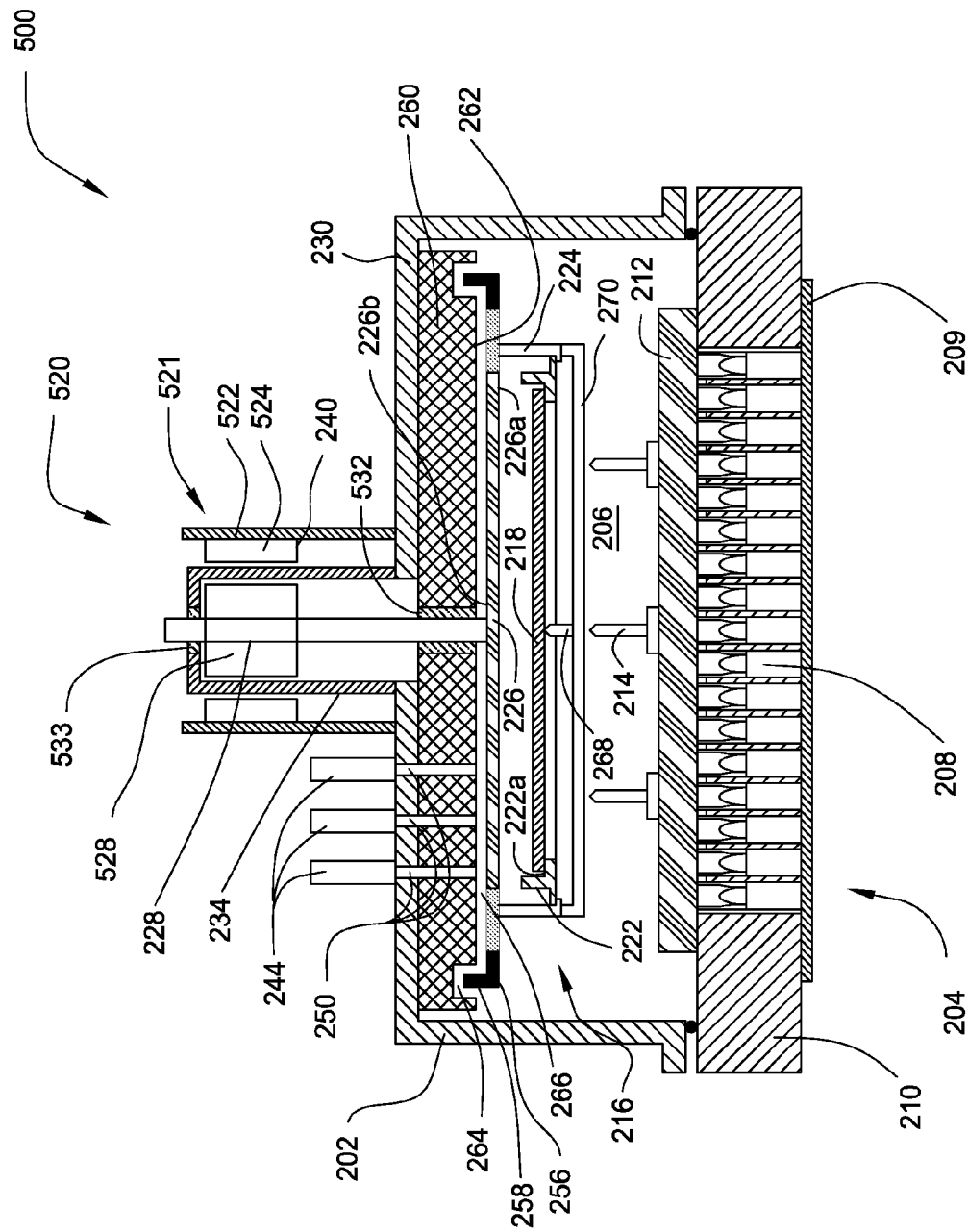
FIG. 5 is a sectional view of a thermal processing chamber according to another embodiment of the present invention.

FIG. 5 is a sectional view of a thermal processing chamber 500 according to another embodiment of the present invention. The thermal processing chamber 500 is similar to the thermal processing chamber 200 except that the thermal processing chamber 500 has a drive mechanism 520 that is different than the drive mechanism 220. The drive mechanism 520 includes a liner motor 521 for moving the substrate support assembly 216 vertically. The linear motor 521 is disposed outside the cylinder 234. The linear motor 521 includes a fixed bar 522 and a mobile part 524 moving relative to the fixed bar 522. An encased magnet 528 is coupled to the shaft 228 inside the cylinder 234. The mobile part 524 may generate electromagnetic fields for engaging the encased magnet 528. The encased magnet 528 moves vertically with the mobile part 524 of the linear motor 521 to raise or lower the substrate support assembly 216. The encased magnet 528 reacts with electromagnets in the mobile part 524 to rotate relative the mobile part 524.

Optionally, air bearings 532 and 533 may be mounted around the shaft 228 above and below the encased magnet 528 to increase the precision of positioning of the substrate support assembly 216.

Alternatively, a screw and nut mechanism may be used in place of the linear motor 521 to drive the substrate support assembly 216 vertically.

FIGS. 6-10 describe several thermal processing chambers including an annular drive mechanism disposed above a substrate support according to embodiments of the present invention. Because the annular drive mechanism is positioned on the opposite side of the heating assembly, the annular drive mechanism does not have to be larger than the heating assembly as in traditional thermal processing chambers. By using an annular drive system, a central region of the thermal processing chamber is not occupied by a drive system, thus, improves process uniformity across the entire substrate.

Figure 6:
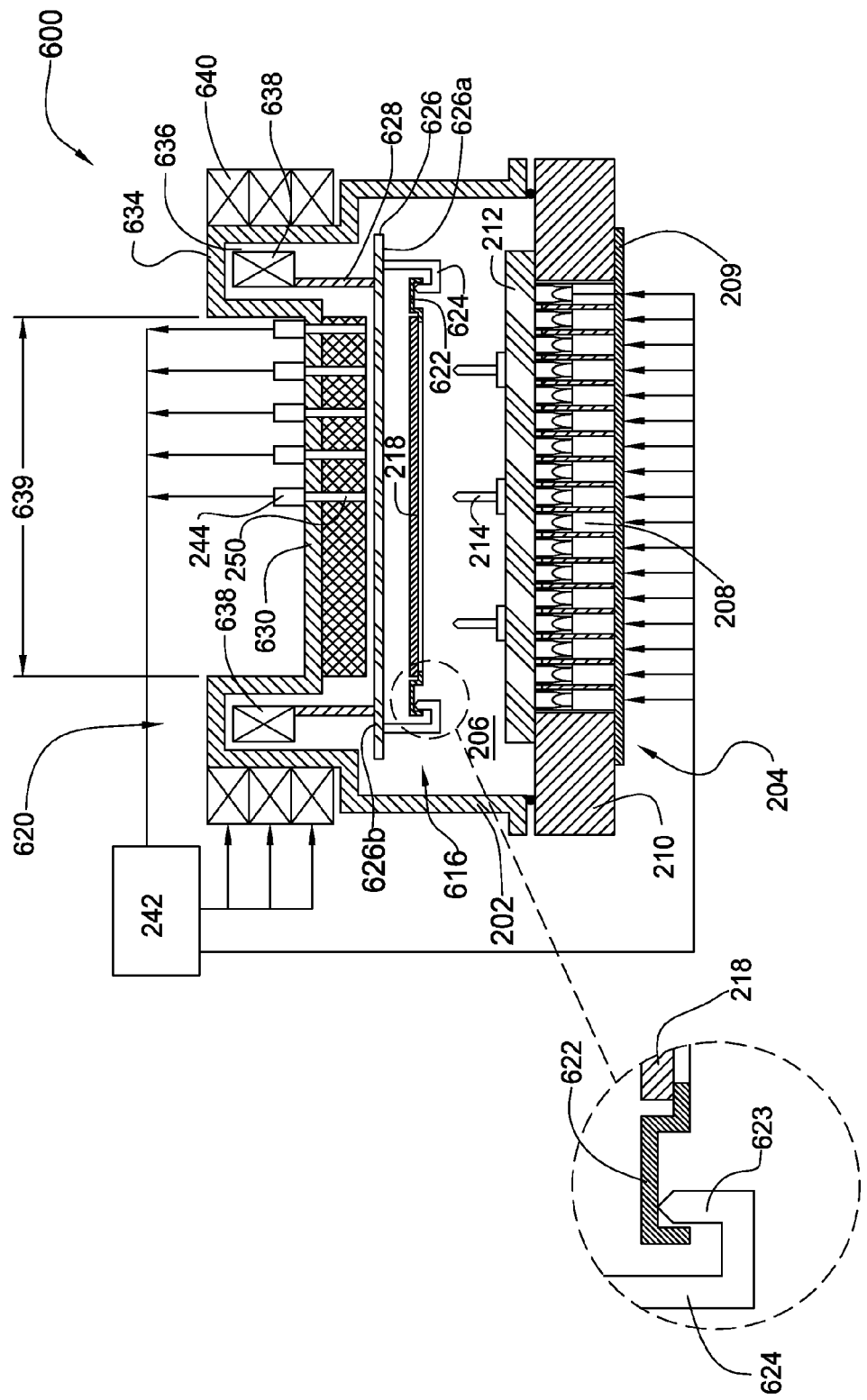
FIG. 6 is a sectional view of a thermal processing chamber according to another embodiment of the present invention.

FIG. 6 is a sectional view of a thermal processing chamber 600 according to another embodiment of the present invention. The thermal processing chamber 600 includes a substrate support assembly 616 having a disk 626, three or more brackets 624 for supporting the susceptor 622 attached to a lower side 626a of the disk 626. Each bracket 624 may have an upright finger 623 with a tip providing a point contact to the susceptor 622.

A ring 628 is attached to an upper side 626b of the disk 626. The ring 628 is further connected to a rotor 638 of a drive mechanism 620. The ring 628 has a diameter large enough to surround the plurality of pyrometers 244 mounted on a chamber lid 630. The ring 628 may be opaque or coated with a reflective coating. During processing, the opaque or reflective ring 628 can prevent stray lights from entering the view ports 250 of the pyrometers 244.

An annular case 634 is attached to the chamber lid 630. The annular case 634 encloses an inner volume 636 for housing the ring 628 and the rotor 638. An inner diameter 639 of the annular case 634 may be similar to the diameter of the substrate 218 so that the plurality of pyrometers 244 are disposed within the inner diameter 639 of the annular case 634. A stator 640 of the driving mechanism 620 is mounted outside the annular case 634. The annular case 634 may be formed from non-ferromagnetic material. The rotor 638 may react with magnetic fields of the stator 640 through the annular case 634 to move the rotor 638 and the ring 628 vertically and rotate the rotor 638 and the ring 628.

Figure 7:
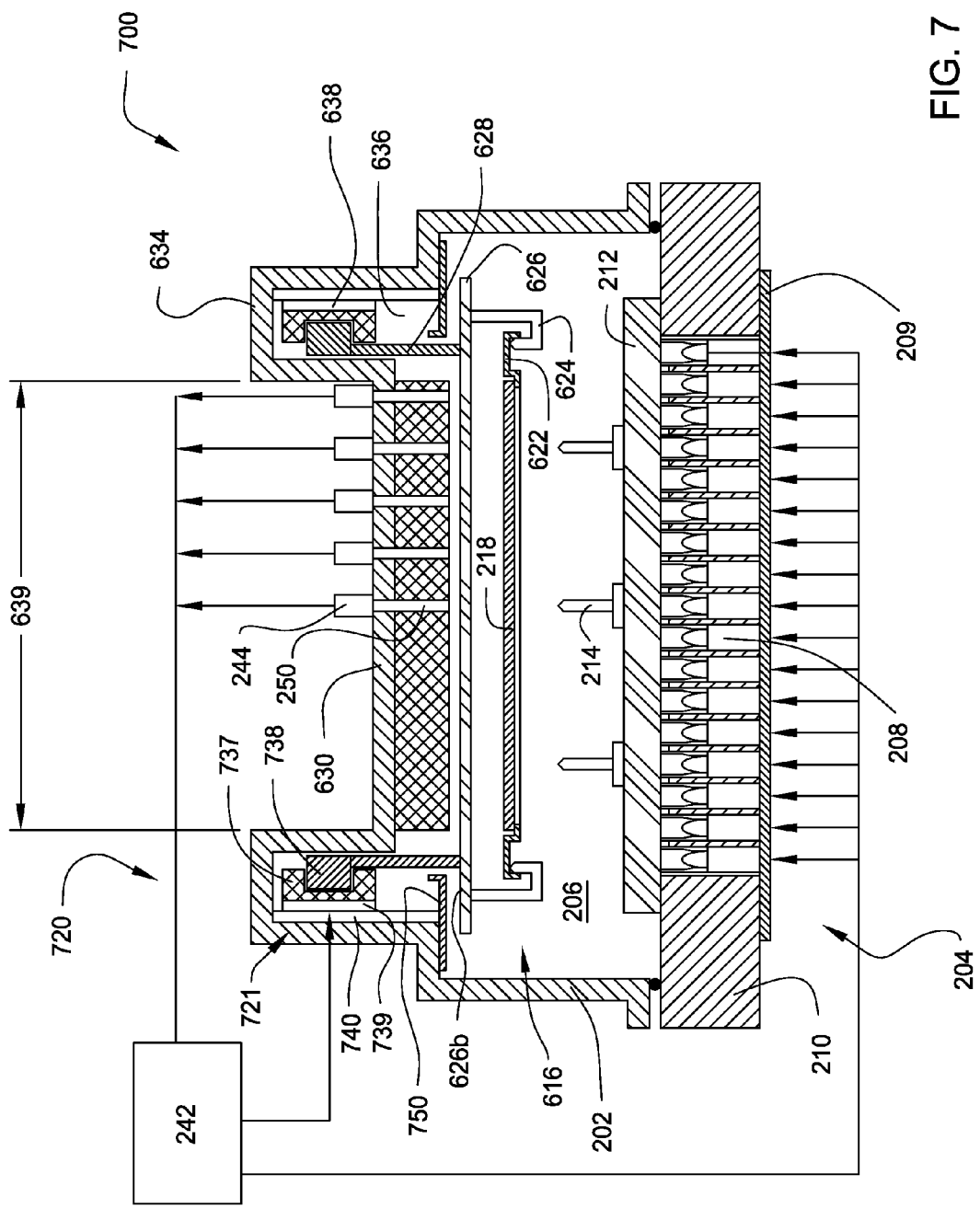
FIG. 7 is a sectional view of a thermal processing chamber according to another embodiment of the present invention.

FIG. 7 is a sectional view of a thermal processing chamber 700 according to another embodiment of the present invention. The thermal processing chamber 700 is similar to the thermal processing chamber 600 except the thermal processing chamber 700 includes a drive mechanism 720 having a linear motor 721 for moving the substrate support assembly 616 vertically. The linear motor 721 includes a fixed bar 740 attached to the annular case 634 inside the inner volume 636 and a mobile part 739 moves relative to the fixed bar 740. An encased magnet 738 is attached to the ring 628 connecting the disk 626. The encased magnet 738 is movably coupled to the mobile part 739 via an air bearing 737. The encased magnet 738 rotates relative to the mobile part 739 to rotate the substrate 218 during processing. A particle tray 750 may be attached to the chamber body 202 near an opening of the inner volume 636 of the annular case 634 to prevent particles from entering the processing volume 206.

Figure 8:
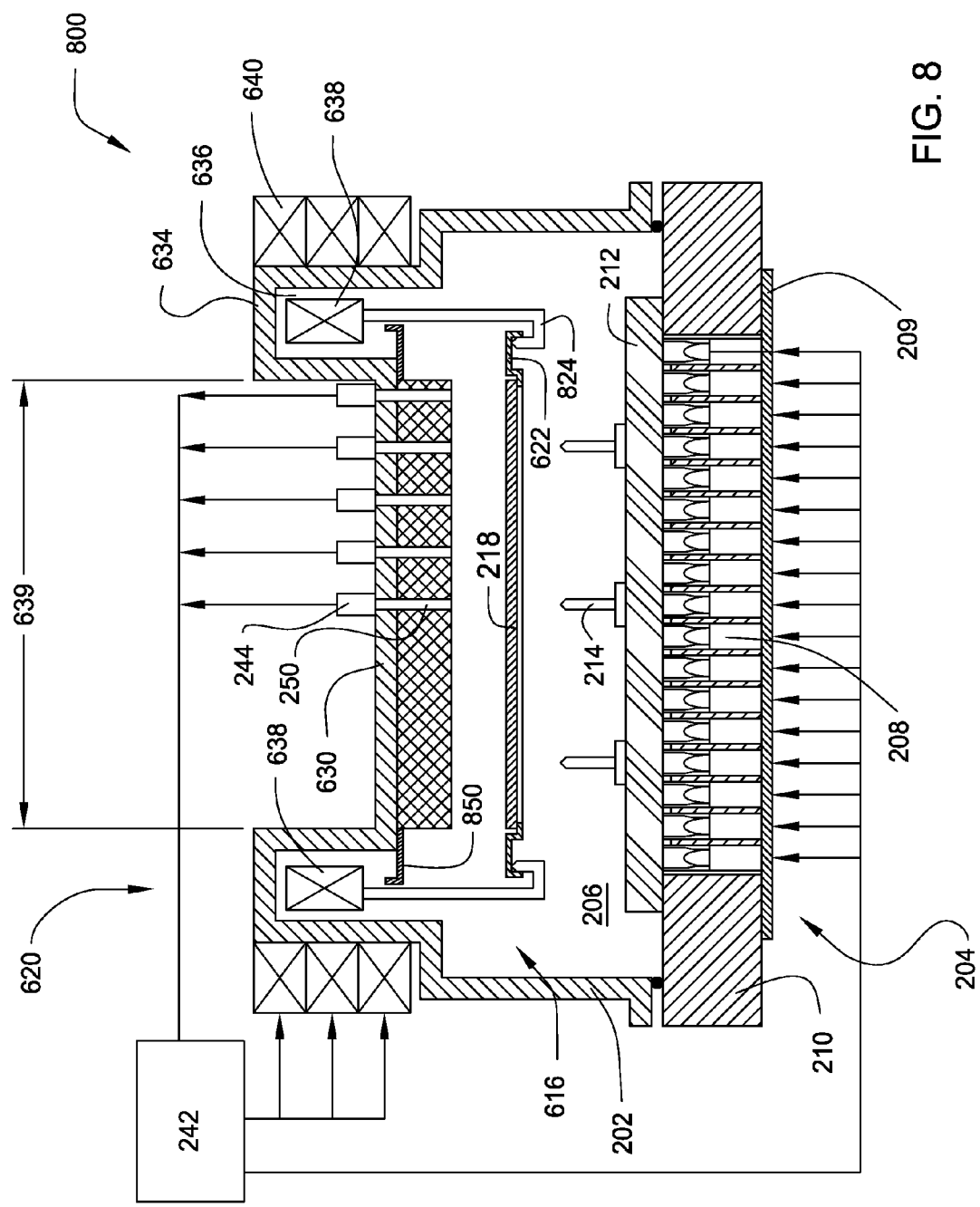
FIG. 8 is a sectional view of a thermal processing chamber according to another embodiment of the present invention.

FIG. 8 is a sectional view of a thermal processing chamber 800 according to another embodiment of the present invention. The thermal processing chamber 800 is similar to the thermal processing chamber 600 except that the processing chamber 800 having a plurality of brackets 824 directly attached to the drive mechanism 620 without a disk or a ring in between. A particle tray 850 may be attached to the chamber body 202 near an opening of the inner volume 636 of the annular case 634 to prevent particles from entering the processing volume 206.

Figure 9:
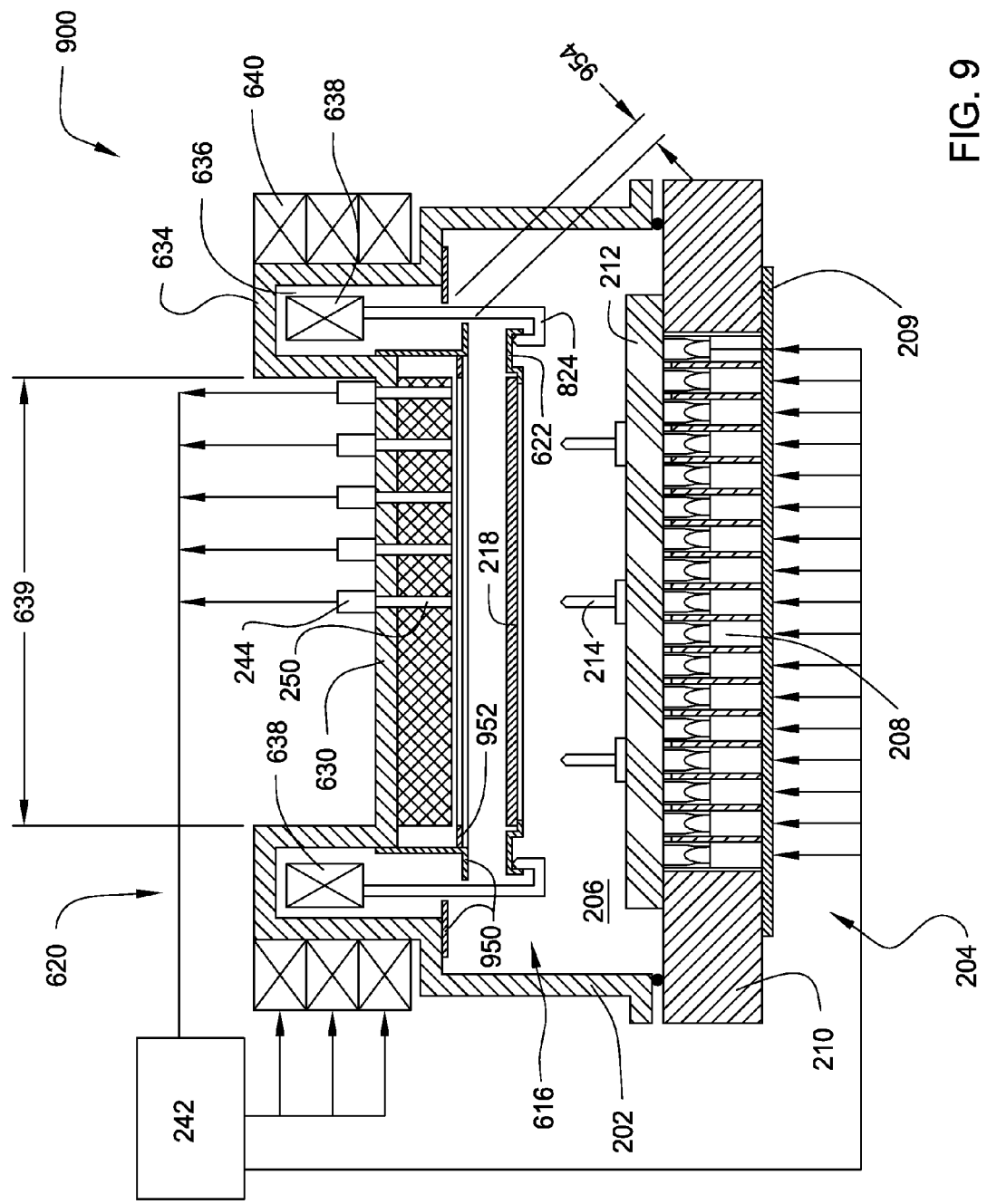
FIG. 9 is a sectional view of a thermal processing chamber according to another embodiment of the present invention.

FIG. 9 is a sectional view of a thermal processing chamber 900 according to another embodiment of the present invention. The thermal processing chamber 900 is similar to the processing chamber 800 except for a labyrinth structure 950 to enclose the inner volume 636 of the annular case 634 to further prevent particle contamination and to block stray lights from the view ports 250. The labyrinth structure 950 may include sheets separating the inner volume 636 and the processing volume 206 leaving an opening 954 for the plurality of brackets 824 to extend therethrough. Optionally, an opaque ring 952 may extend horizontally and radially inwardly from the labyrinth structure 950 to block additional stray lights.

Figure 10A:
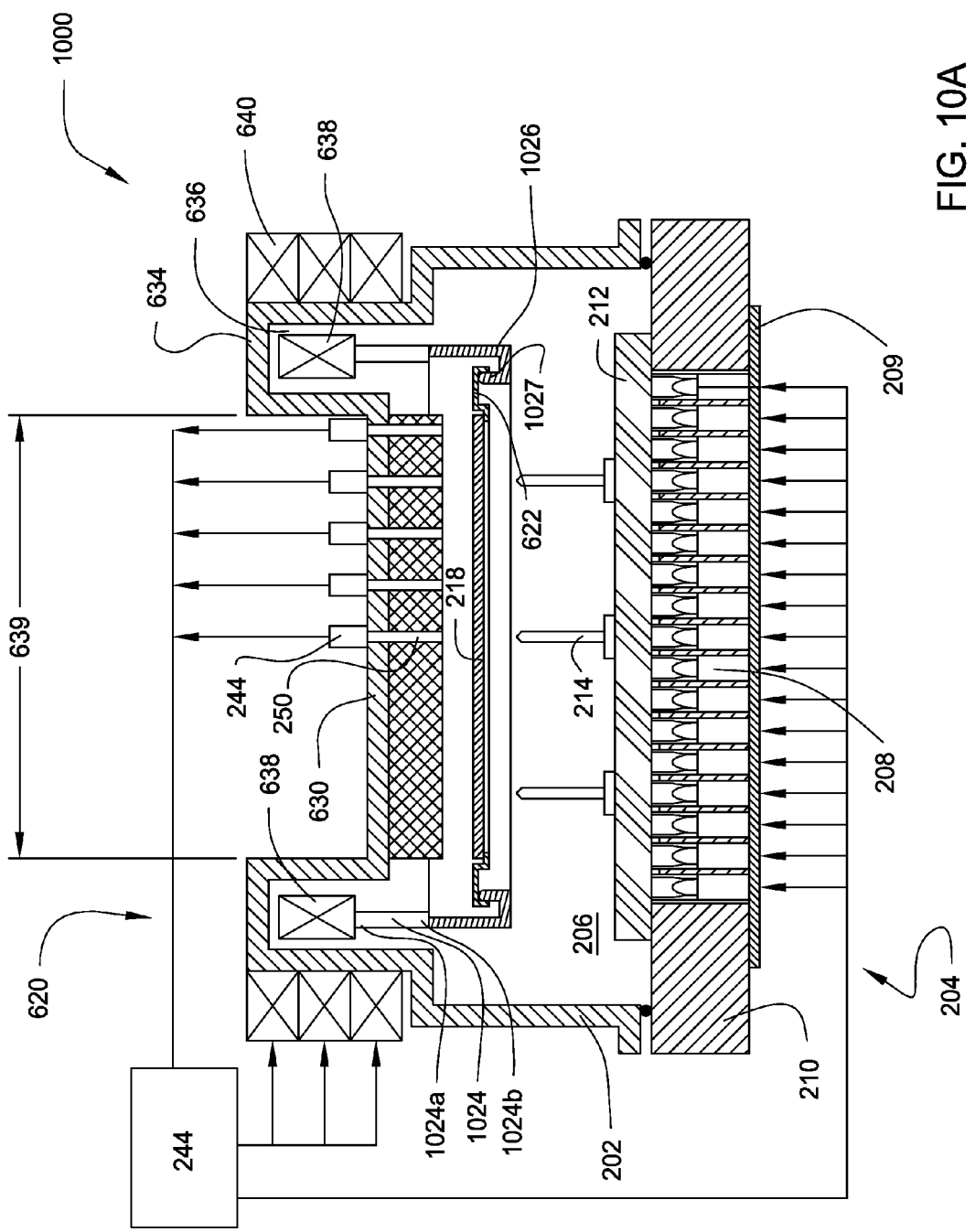
FIGS. 10A-10B are sectional views of a thermal processing chamber according to another embodiment of the present invention.
Figure 10B:
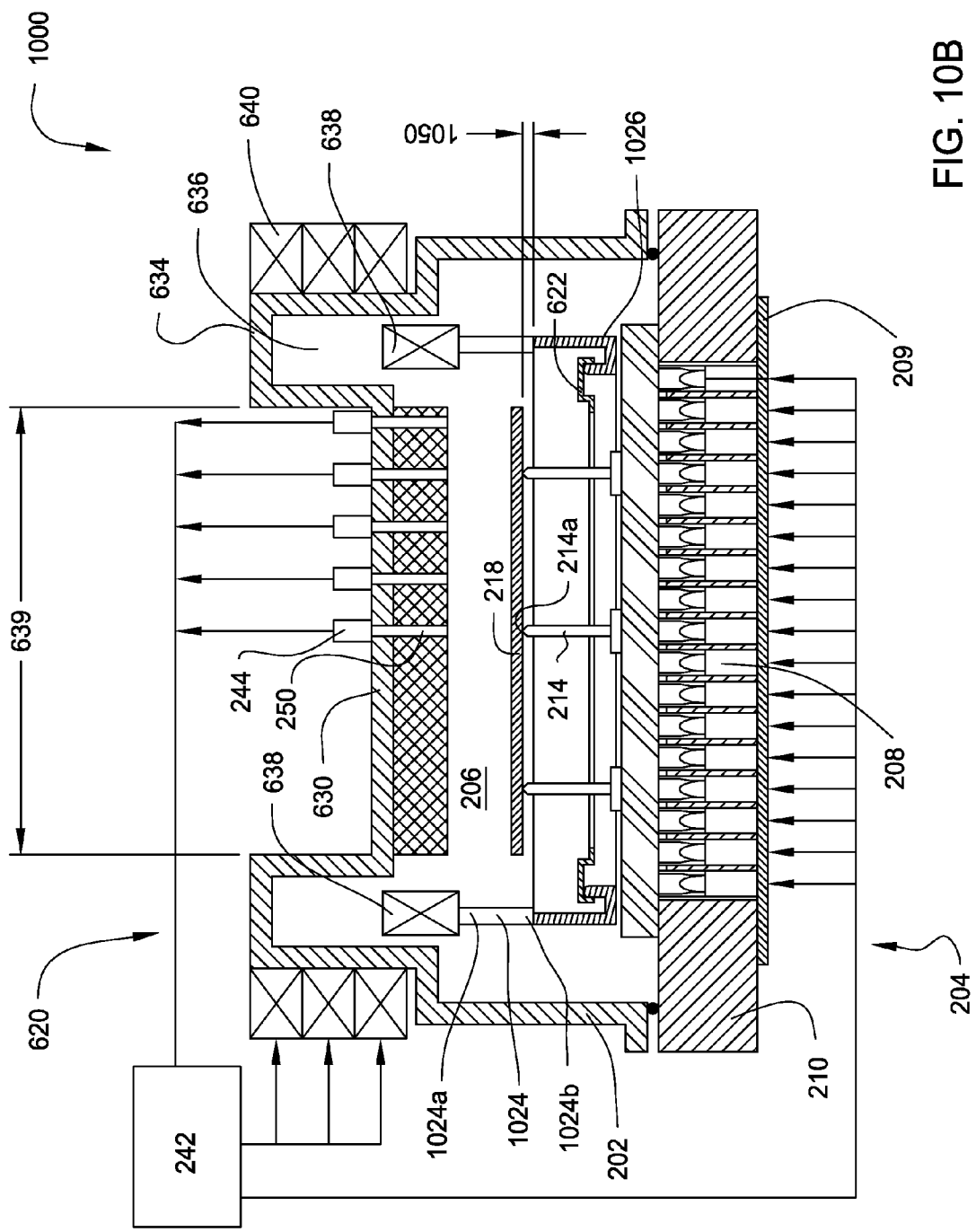

FIGS. 10A-10B are sectional views of a thermal processing chamber 1000 according to another embodiment of the present invention. The thermal processing chamber 1000 includes a plurality of brackets 1024 each having an upper end 1024a attached to the rotor 638 of the annular drive mechanism 620 and a lower end 1024b attached to a ring 1026. The ring 1026 has an inner lip 1027 for supporting the susceptor 622.

FIG. 10A illustrates the thermal processing chamber 1000 at a processing position. The lower ends 1024b of the brackets 1024 are raised to be inside the inner volume 636 of the annular case 634 so that the ring 1026, the susceptor 622 and the chamber lid 630 or reflective plate if present form an enclosure around the substrate 218 and the view ports 250. The ring 1026 may be opaque so that the enclosure is light tight preventing lights from the radiant heating sources 208 from entering the view ports 250 of the pyrometers 244. The enclosure also prevents particles generated in the moving parts from entering.

FIG. 10B illustrates the thermal processing chamber 1000 at a loading position. The lower ends 1024b are lowered below top tips 214a of the push pins 214 forming a gap 1050. A substrate transfer robot may enter the processing volume 206 between the brackets 1024 within the gap 1050 to pick-up the processed substrate and deliver a new substrate for processing.

While the foregoing is directed to embodiments of the present invention, other and further embodiments of the invention may be devised without departing from the basic scope thereof, and the scope thereof is determined by the claims that follow.

What is claimed is:

1. An apparatus for thermal processing a substrate, comprising:
  a chamber body defining a processing volume;
  a heating assembly disposed under the processing volume, wherein the heating assembly comprises a plurality of radiant heating sources directing radiant energy toward the processing volume;
  a substrate support assembly operable to position a substrate over the heating assembly in the processing volume; and
  a drive mechanism operable to rotate the substrate support assembly and move the substrate assembly vertically, wherein the drive mechanism is disposed above the substrate support assembly, wherein the substrate support assembly comprises:
    a disk disposed in the processing volume, wherein the disk has a lower surface facing the heating assembly and an upper surface facing a chamber lid, and the disk is connected to the drive mechanism from the upper surface; and
    a plurality of brackets extending from the lower surface of the disk, wherein the plurality of brackets form a supporting surface.

2. The apparatus of claim 1, wherein the chamber body comprises a cylinder coupled to the chamber lid and enclosing an inner volume, the substrate support assembly further comprises a shaft extending from the disk at a central region of the upper surface to the inner volume of the cylinder, and an upper end of the shaft is coupled to the drive mechanism.

3. The apparatus of claim 2, wherein the drive mechanism comprises a magnetic rotor having a permanent magnet attached to the upper end of the shaft and electromagnets disposed outside the cylinder.

4. The apparatus of claim 2, wherein the drive mechanism comprises:
  an encased magnet coupled to the upper end of the shaft within the inner volume of the cylinder; and
  a linear motor disposed outside the cylinder, wherein a mobile part of the linear motor generates electromagnetic fields for engaging the encased magnet coupled to the shaft.

5. The apparatus of claim 2, further comprising a plurality of pyrometers mounted on the chamber lid and configured to measure temperature of the substrate through a plurality of view ports formed through the chamber lid.

6. The apparatus of claim 5, wherein the disk has:
  a central zone corresponding to a surface of the substrate being processed, wherein the central zone is transparent to wavelengths within the operating range of the plurality of pyrometers;
  a middle annular zone radially outside the central zone, wherein the middle annular zone includes absorbers, reflectors, or scatters for modulating radiation at wavelengths within the operating range of the plurality of pyrometers; and
  an outer annular zone radially outside the middle annular zone, wherein the outer annular zone is opaque to radiation at wavelengths within the operating range of the plurality of pyrometers.

7. The apparatus of claim 5, wherein the disk has a surface with a plurality of windows transparent to wavelengths within the operating range of the plurality of pyrometers, the surface is opaque and/or reflective to radiation at wavelengths within the operating range of the plurality of pyrometers, and the plurality of windows are distributed along a plurality of radii corresponding to the plurality of pyrometers.

8. The apparatus of claim 1, wherein the substrate support assembly further comprises a ring extending from the upper surface of the disk, and an upper end of the ring is coupled to the drive mechanism.

9. The apparatus of claim 1, wherein the plurality of brackets have a tear drop cross section to minimize turbulence during processing.

10. The apparatus of claim 2, wherein the disk, the shaft and the plurality of brackets are formed from quartz.

11. An apparatus for thermal processing a substrate, comprising:
  a chamber body defining a processing volume, wherein the chamber body comprises an annular case attached above a chamber lid, and the annular case defines an inner volume;
  a heating assembly disposed under the processing volume, wherein the heating assembly comprises a plurality of radiant heating sources directing radiant energy toward the processing volume;
  a substrate support assembly operable to position a substrate over the heating assembly in the processing volume; and
  a drive mechanism operable to rotate the substrate support assembly and move the substrate assembly vertically, wherein the drive mechanism is disposed above the substrate support assembly, wherein the substrate support assembly comprises:
    a plurality of brackets coupled to the drive mechanism, wherein the plurality of brackets rotate and move vertically within the inner volume of the annular case; and
    a susceptor disposed over a supporting surface of the plurality of brackets, wherein the susceptor is configured to support the substrate at an edge region.

12. The apparatus of claim 11, further comprising a particle tray positioned at a lower end of the inner volume.

13. The apparatus of claim 11, further comprising a labyrinth structure enclosing the inner volume.

14. An apparatus for thermal processing a substrate, comprising:
  a chamber body defining a processing volume;
  a heating assembly disposed under the processing volume, wherein the heating assembly comprises a plurality of radiant heating sources directing radiant energy toward the processing volume;

a substrate support assembly operable to position a substrate over the heating assembly in the processing volume; and a drive mechanism operable to rotate the substrate support assembly and move the substrate assembly vertically, wherein the drive mechanism is disposed above the substrate support assembly, wherein the substrate support assembly comprises:

a plurality of brackets, wherein upper ends of the plurality of brackets are coupled to the drive mechanism, and the plurality of brackets rotate and move vertically within an inner volume of an annular case.

15. The apparatus of claim 14, wherein the substrate support assembly further comprises:

a ring coupled to lower ends of the plurality of brackets, wherein the ring partially retrieves to the inner volume when the plurality of brackets are at a raised position;

a susceptor disposed on a lower lip of the ring, wherein the susceptor is configured to support the substrate at an edge region.

16. The apparatus of claim 15, wherein the ring is opaque.

17. A method for processing a substrate comprising:

suspending a substrate in a processing chamber over a heating assembly with a substrate support assembly, wherein a drive mechanism and the heating assembly are disposed on opposite sides of the substrate support assembly;

rotating the substrate using the drive mechanism; and directing radiant energy towards a backside of the substrate from the heating assembly, wherein suspending the substrate comprises:

positioning the substrate on an edge ring or a plurality of support pins supported on a plurality of brackets connected to the drive mechanism; and raising the plurality of brackets.

* * * * *